US012635260B2

(12) United States Patent
Shi et al.

(10) Patent No.: US 12,635,260 B2
(45) Date of Patent: May 19, 2026

(54) WAVEGUIDE EDGE HAVING REDUCED REFLECTIVITY

(71) Applicant: Snap Inc., Santa Monica, CA (US)

(72) Inventors: Cheng Shi, Didcot (GB); Xinya Xu, Wantage (GB)

(73) Assignee: Snap Inc., Santa Monica, CA (US)

( * ) Notice: Subject to any disclaimer, the term of this patent is extended or adjusted under 35 U.S.C. 154(b) by 1 day.

(21) Appl. No.: 18/603,095

(22) Filed: Mar. 12, 2024

(65) Prior Publication Data

US 2024/0313140 A1      Sep. 19, 2024

Related U.S. Application Data

(60) Provisional application No. 63/489,952, filed on Mar. 13, 2023.

(51) Int. Cl.
*H10F 19/30*          (2025.01)
*G02B 1/11*          (2015.01)
(Continued)

(52) U.S. Cl.
CPC .............. *H10F 19/30* (2025.01); *G02B 1/11* (2013.01); *G02B 5/003* (2013.01); *H10F 10/172* (2025.01); *H10F 77/90* (2025.01)

(58) Field of Classification Search
CPC ....................................................... H01F 19/30
See application file for complete search history.

(56) References Cited

U.S. PATENT DOCUMENTS 8,981,213 B1 *   3/2015   Micallef .............. H01G 9/2068
                                                                  136/263
2005/0110005 A1 *   5/2005   Forrest ................... H10K 10/40
                                                                  257/40
(Continued)

FOREIGN PATENT DOCUMENTS

CN          120883093 A       10/2025
WO      WO-2024192048 A1      9/2024

OTHER PUBLICATIONS

"International Application Serial No. PCT/US2024/019601, Invitation to Pay Additional Fees mailed Jun. 19, 2024", 8 pgs.
(Continued)

*Primary Examiner* — Robert A Vetere
(74) *Attorney, Agent, or Firm* — Schwegman Lundberg & Woessner, P.A.

(57)          ABSTRACT
An augmented reality system can include a waveguide having an edge surface that extends between opposing light-guiding surfaces. The waveguide can guide light toward the edge surface. The waveguide can include a reflectivity-reducing film, such as an absorptive film or a photovoltaic film, disposed on the edge surface. To form the reflectivity-reducing film, curable material can be disposed onto a dissolvable film. The curable material can be cured while disposed on the dissolvable film such that the cured material forms a reflectivity-reducing structure on the dissolvable film. The dissolvable film can be dissolved such that the reflectivity-reducing structure remains intact as a reflectivity-reducing film that can be adhered to the edge surface, such as with a primer layer. The edge surface can include nanostructures, sized smaller than half a wavelength of the guided light, that can reduce a reflectivity of the edge surface.

16 Claims, 14 Drawing Sheets

(51) Int. Cl.
    *G02B 5/00*         (2006.01)
    *H10F 10/172*      (2025.01)
    *H10F 77/90*       (2025.01)

(56)            References Cited

U.S. PATENT DOCUMENTS

| | | | | |
|---|---|---|---|---|
| 2008/0108171 | A1* | 5/2008 | Rogers | H10F 10/16 |
| | | | | 438/455 |
| 2012/0118381 | A1* | 5/2012 | Debije | G02B 6/0058 |
| | | | | 362/621 |
| 2016/0259520 | A1* | 9/2016 | Gatland | G01S 15/86 |
| 2019/0285794 | A1 | 9/2019 | Kim et al. | |
| 2020/0064539 | A1 | 2/2020 | Kim et al. | |
| 2020/0350125 | A1* | 11/2020 | Park | H10K 30/10 |
| 2021/0103147 | A1 | 4/2021 | Melli | |
| 2022/0221723 | A1 | 7/2022 | Gao et al. | |

OTHER PUBLICATIONS

"Best-research-cell-efficiencies 2021", NREL, https://www.nrel.gov/pv/assets/pdfs/best-research-cell-efficiencies.pdf, (2021), 1 pg.

"Biomimetic—Nature's Ingenuity on Surface Engineering", biomimetic.gr, [Online] Retrieved from the Internet: <URL: https://web.archive.org/web/20211221174902/https://www.biomimetic.gr/>, Retrieved on Sep. 5, 2025, (2021), 4 pgs.

"International Application Serial No. PCT/US2024/019601, International Search Report mailed Aug. 14, 2024", 6 pgs.

"International Application Serial No. PCT/US2024/019601, Written Opinion mailed Aug. 14, 2024", 9 pgs.

Jeong, Jaeki, et al., "Pseudo-halide Anion Engineering for a-FAPbl3 perovskite solar cells", Nature, 592(7854), (2021), 381-385.

"International Application Serial No. PCT/US2024/019601, International Preliminary Report on Patentability mailed Sep. 25, 2025", 10 pgs.

\* cited by examiner

400

102

114

202

108

120

Figure 9:
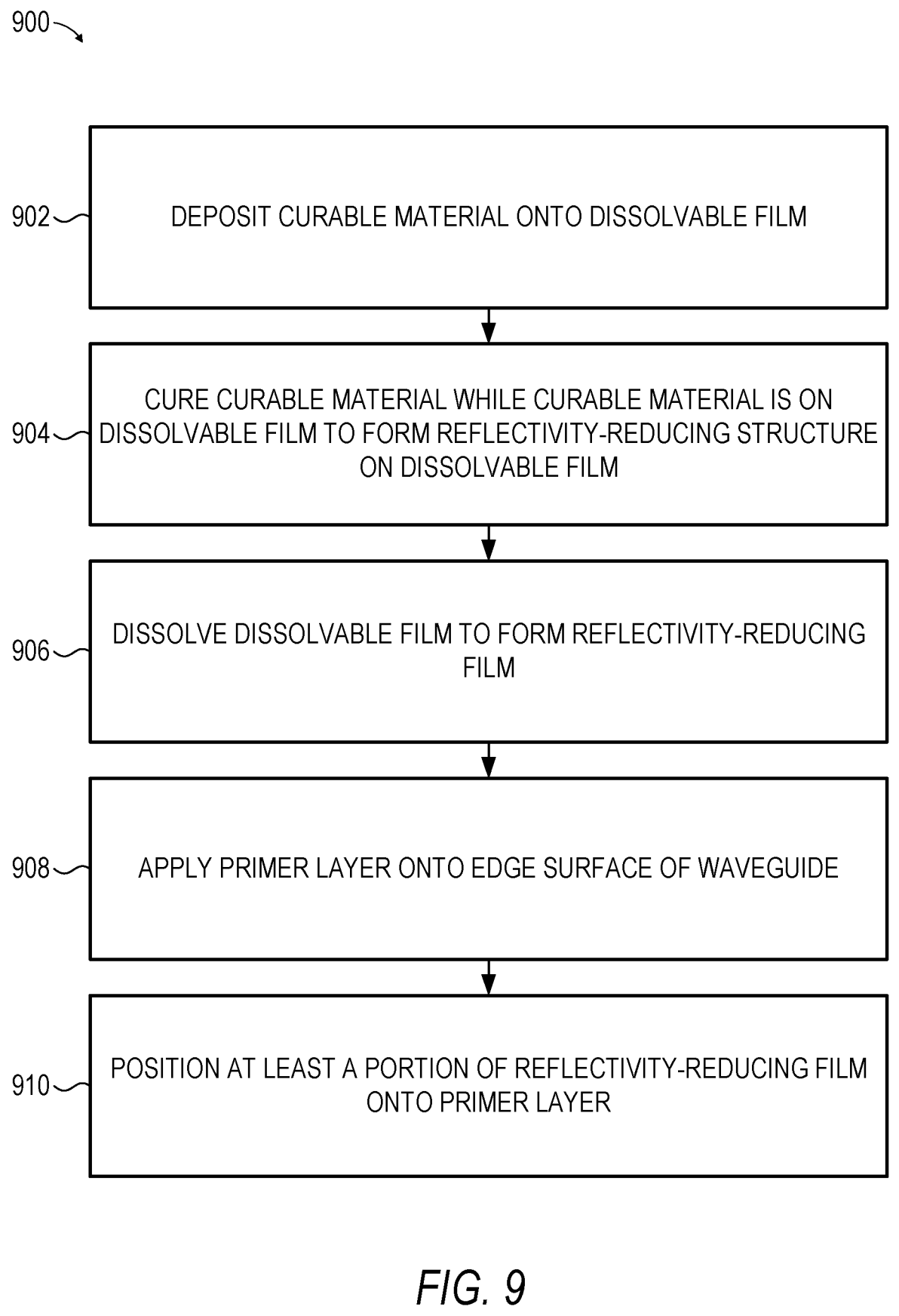

900

| 902 | DEPOSIT CURABLE MATERIAL ONTO DISSOLVABLE FILM |
|---|---|

| 904 | CURE CURABLE MATERIAL WHILE CURABLE MATERIAL IS ON DISSOLVABLE FILM TO FORM REFLECTIVITY-REDUCING STRUCTURE ON DISSOLVABLE FILM |
|---|---|

| 906 | DISSOLVE DISSOLVABLE FILM TO FORM REFLECTIVITY-REDUCING FILM |
|---|---|

| 908 | APPLY PRIMER LAYER ONTO EDGE SURFACE OF WAVEGUIDE |
|---|---|

| 910 | POSITION AT LEAST A PORTION OF REFLECTIVITY-REDUCING FILM ONTO PRIMER LAYER |
|---|---|

WAVEGUIDE EDGE HAVING REDUCED REFLECTIVITY

CROSS-REFERENCE TO RELATED APPLICATION

This application claims the benefit of U.S. Provisional Application Ser. No. 63/489,952, filed on Mar. 13, 2023, which is hereby incorporated by reference in its entirety.

FIELD OF THE DISCLOSURE

The present disclosure relates to waveguides, such as for use in augmented reality displays.

BACKGROUND OF THE DISCLOSURE

An augmented reality headset may include at least one display that can display additional content to the user, which can appear to the user as being superimposed on real-world objects proximate the user. There is ongoing effort to improve augmented reality headsets.

BRIEF DESCRIPTION OF THE DRAWINGS

FIG. 9 shows a flow chart for some examples of a method for reducing reflections in a waveguide.

Corresponding reference characters indicate correspond-ing parts throughout the several views. Elements in the drawings are not necessarily drawn to scale. The configu-rations shown in the drawings are merely examples and should not be construed as limiting in any manner.

DETAILED DESCRIPTION

Figure 1:
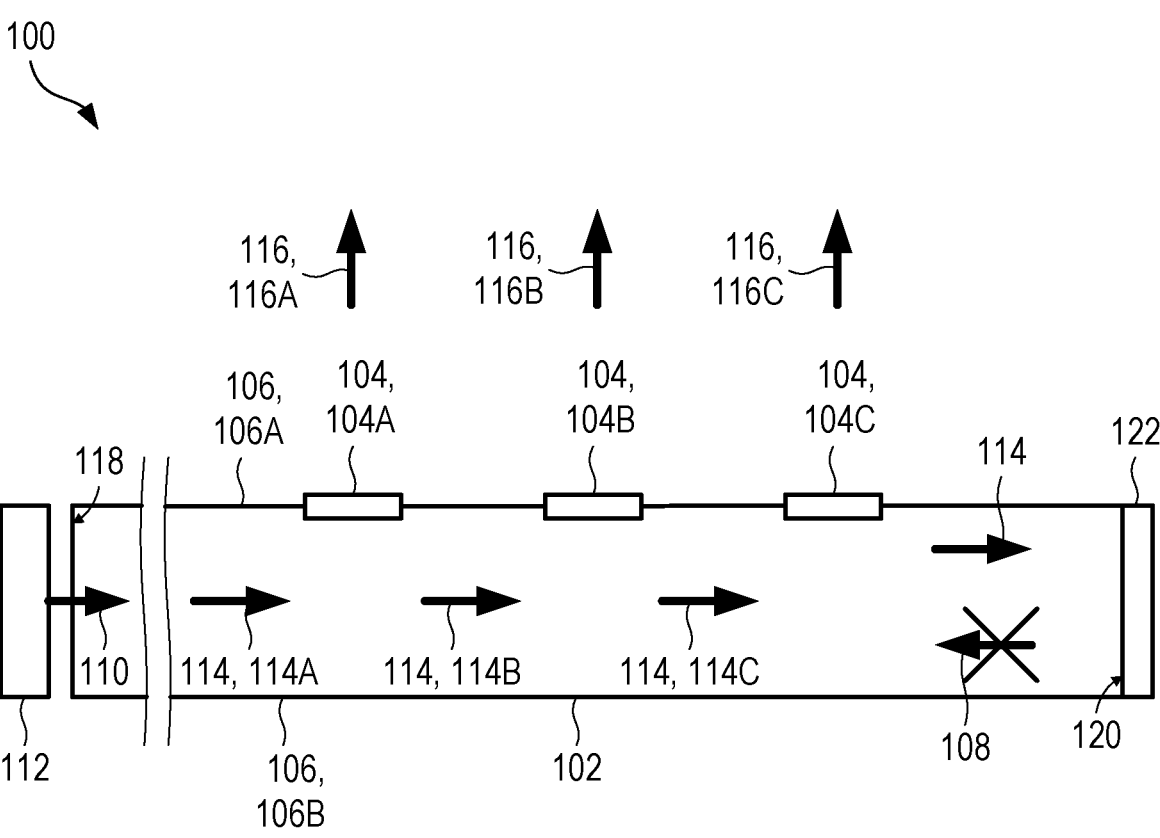
FIG. 1 shows a side view of some examples of an augmented reality system.

An augmented reality headset can include two displays. Each display can be located proximate a respective eye of a user. The displays can be worn, such as in the form of spectacles or a headset. Each display can be at least partially transparent, such that the user can observe real-world objects proximate the user through each display. Each display can display additional content to the user, which can appear to the user as being superimposed on the real-world objects proximate the user.

In some examples of augmented reality display, a light source can direct light into a waveguide. The waveguide can extend over a surface area of the display. The waveguide can guide light as guided light from the light source to all, most, or at least some of the surface area of the waveguide. Diffractive elements, distributed over the surface area of the waveguide, can extract at least some of the guided light from the waveguide and direct the extracted light toward an eye of the user. The light extracted from the waveguide by the diffractive elements provides additional content to the user. Because the diffractive elements may occupy a relatively small fraction of the surface area of the waveguide, the remaining surface area of the waveguide can be at least partially transparent, which can allow the user to view the surrounding real-world objects through the waveguide.

To help avoid having differences in brightness over the surface area of the display, such as a portion of the display relatively close to the light source being brighter than another portion of the display that is relatively far from the light source, the diffractive elements can vary in size and/or shape over the surface area of the waveguide. For example, a diffractive element that is relatively close to the light source may be shaped and sized to have a relatively low diffraction efficiency (e.g., a value between zero and one representing a fraction of incident light that is coupled into a specified diffractive order), while a diffractive element that is relatively far from the light source may be shaped and sized to have a relatively high diffraction efficiency.

If the diffractive elements do not fully extract all of the guided light from the waveguide, a portion of the guided light may reflect from an edge surface of the waveguide to form spurious reflected light in the waveguide. The diffrac-tive elements may direct some of the spurious reflected light toward the eye of the viewer as a ghost image, which can reduce a contrast or compromise the integrity of an image formed by the display.

The augmented reality system and method described below can help reduce reflections from the edge surface of the waveguide. For example, the waveguide can include a reflectivity-reducing film, such as an absorptive film or a photovoltaic film, disposed on the edge surface. In some examples, the photovoltaic film can convert the reflected light into electrical energy, which can be stored by a battery and can help reduce an overall power consumption of the augmented reality system.

To form the reflectivity-reducing film, curable material can be disposed onto a dissolvable film. The curable material can be cured while disposed on the dissolvable film such that the cured material forms a reflectivity-reducing structure on the dissolvable film. The dissolvable film can be dissolved such that the reflectivity-reducing structure remains intact as a reflectivity-reducing film that can be adhered to the edge surface, such as with a primer layer. In some examples, the curing can cause stresses to the substrate on which the curable material is cured, which can alter a shape of the substrate or cause microfractures in a surface of the substrate. For example, in a system in which a curable material is deposited directly onto the edge surface of the waveguide and cured while on the edge surface, the curing can cause stresses on the edge surface and may alter a shape of the waveguide, which can lead to distortions of the displayed image. Using the dissolvable film as explained herein can cause stresses in the dissolvable film, rather than stresses on the edge surface. When the dissolvable film is dissolved, the stresses disappear, so that adhering the reflectivity-reducing film to the edge surface may avoid causing stresses on the edge surface, which may help avoid altering a shape of the waveguide and may help reduce or prevent distortions of the displayed image.

According to some examples, the edge surface of the waveguide can include nanostructures, sized smaller than half of a wavelength of the guided light, that can reduce a reflectivity of the edge surface. The nanostructures can form a gradient in effective refractive index at the edge surface of the waveguide, which can reduce reflections from the edge surface. Compared to an edge surface that lacks the gradient in effective refractive index, such as a planar interface between the waveguide material and air, the edge surface that includes the nanostructures can reduce or eliminate the reflections from the edge surface, which can improve a contrast of the display.

FIG. 1 shows a side view of some examples of an augmented reality system 100. The augmented reality system 100 of FIG. 1 is but one example of an augmented reality system that can include a reflection-reducing element disposed on an edge surface of a waveguide to reduce a reflectivity of the edge surface. Other suitable augmented reality systems can also be used.

The augmented reality system 100 can include a waveguide 102. The waveguide 102 may be referred to as a light guide. For the purposes of this document, the terms waveguide and light guide are used interchangeably. The waveguide 102 can be configured as a planar light guide, with light guiding surfaces 106, such as a light-guiding surface 106A and an opposing light-guiding surface 106B. During operation of the augmented reality system 100, the waveguide 102 can guide guided light 114 via total internal reflection from the light-guiding surface 106A and the light-guiding surface 106B. For example, the guided light 114 may experience multiple reflections from the opposing light guiding surface 106. In some examples, the waveguide 102 can be planar, such that the light guiding surfaces 106 are planar and parallel. In other examples, the waveguide 102 can be curved with a relatively large radius of curvature. For example, the waveguide 102 can optionally be shaped in the form of a spectacle lens, which has opposing light guiding surfaces 106 that are both curved outward from a user's eye to avoid contact with the user's eyelashes. The waveguide 102 can be formed from a material that is transparent or at least partially transparent for wavelengths in the visible portion of the electromagnetic spectrum, such as between about 400 nm and about 700 nm. Suitable materials for the waveguide 102 include glass, fused silica, an optical plastic such as polycarbonate, and others.

The augmented reality system 100 can include a plurality of diffractive elements 104 positioned over or within an area of a light-guiding surface 106 of the waveguide 102. In the configuration of FIG. 1, the diffractive elements 104 are positioned over or within an area of the light-guiding surface 106A. Alternatively, the diffractive elements 104 can be positioned over or within an area of the light-guiding surface 106B. FIG. 1 shows the augmented reality system 100 as including three diffractive elements 104A, 104B, and 104C. In practice, an actual augmented reality system 100 can include significantly more than three diffractive elements, such as hundreds, thousands, or hundreds of thousands of diffractive elements 104.

The augmented reality system 100 can include a light source 112 disposed at a first edge 118 of the light-guiding surfaces 106 of the waveguide 102. Suitable light sources can include light emitting diodes, such as white light emitting diodes or single-wavelength light emitting diodes, such as red light emitting diodes, green light emitting diodes, and blue light emitting diodes, laser diodes, or other suitable light sources. The light source 112 can direct light 110 into the waveguide 102. The waveguide 102 can be configured to guide light 110 from the light source as guided light 114. The light source 112 may be referred to as a projector or light engine, which may include a reflective, transmissive, or emissive display panel, such as a liquid crystal on silicon (LCoS) or microLED display. The light source 112 may also include optics, such as one or more lenses, to focus an image from the display panel as a pupil onto an input grating of the waveguide 102.

The diffractive elements 104 can extract guided light 114 out of the waveguide 102 as extracted light 116. The diffractive elements 104 can vary in at least one of size and shape. As the guided light 114 propagates away from the light source 112, such as with increasing distance away from the first edge 118 of the light-guiding surfaces 106, the amount of guided light 114 within the waveguide 102 can decrease. The "amount" of guided light 114 can correspond to the energy of the guided light in the waveguide 102, with the amount of energy decreasing as diffractive elements 104 can extract guided light 114 out of the waveguide 102 as the guided light 114 propagates away from the light source 112. For example, near the light source 112, the first amount of guided light 114A can be relatively high. A first diffractive element 104A can extract some light 116, such as an extracted portion of light 116A, out of the waveguide 102, such that a second amount of guided light 114B is less than the first amount of guided light 114A. A second diffractive element 104B can also extract some light 116, such as an extracted portion of light 116B, out of the waveguide 102, such that a third amount of guided light 114C is less than the second amount of guided light 114B. A third diffractive element 104C can also extract some light 116, such as an extracted portion of light 116C, out of the waveguide 102, and so forth.

It should be noted that in practice, the diffractive elements 104 may not individually extract light from the waveguide 102 to produce the extracted light 116, but may act in concert with adjacent diffractive elements 104 to replicate the input pupil across an area of the waveguide 102 surface to both produce the extracted light 116 and ensure that the projected image may be seen at a range of viewing angles over as large an area as possible. For example, the diffractive elements 104 can be spaced with a spacing that allows the guided light 114 to be directed into extracted light 116 having a specified propagation direction or a specified range of propagation directions. The diffractive elements 104 can have a size and shape that vary over a surface area of the light-guiding surface 106 of the waveguide 102. The size and shape of the diffractive elements 104 can determine, at least in part, how much of the guided light 114 is extracted to form the extracted light 116, as a function of location across the light-guiding surface 106 of the waveguide 102.

The augmented reality system 100 can include an edge surface 120 that extends between the opposing light-guiding surfaces 106A, 106B of the waveguide 102. The waveguide 102 can guide guided light 114 between the opposing light-guiding surfaces 106A, 106B toward the edge surface 120. In some examples, the edge surface 120 can be planar. In some examples, the edge surface 120 can be orthogonal or substantially orthogonal to the light-guiding surface 106A and the light-guiding surface 106B. In some examples, the edge surface 120 can be angled non-orthogonally with respect to the light-guiding surface 106A and the light-guiding surface 106B. In some examples, the edge surface 120 can be rounded. In some examples, the edge surface 120 can include one or more corners.

The augmented reality system 100 can include a reflection-reducing element 122 disposed on the edge surface 120 to reduce a reflectivity of the edge surface 120. The reflection-reducing element 122 can receive at least some guided light 114 that strikes the reflection-reducing element 122. In response to receiving the guided light 114, the reflection-reducing element 122 can produce a diminished reflection 108 or may not produce a reflection at all. Specifically, the diminished reflection 108 may include less optical power than a reflection from a planar interface between the waveguide 102 and air. By reducing or eliminating the amount of light that is reflected, the reflection-reducing element 122 can reduce spurious stray light that may be included with the extracted light 116 and can therefore increase a contrast of an image produced by the augmented reality system 100.

Figure 2:
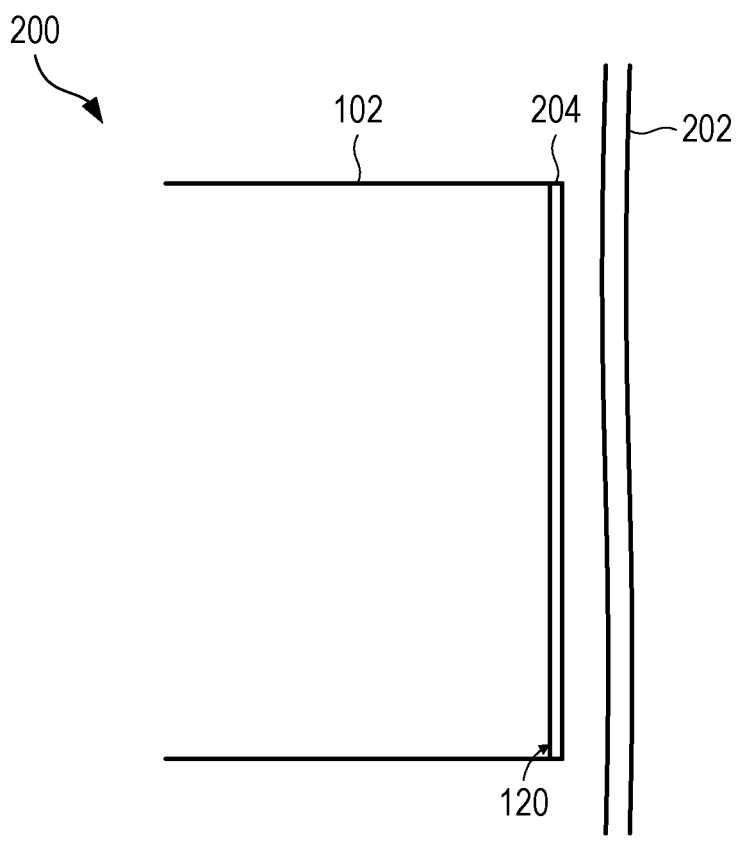
FIG. 2 shows a side view of some examples of a portion of an augmented reality system, in which a reflectivity-reducing film is to be adhered to an edge surface of a waveguide.
Figure 3:
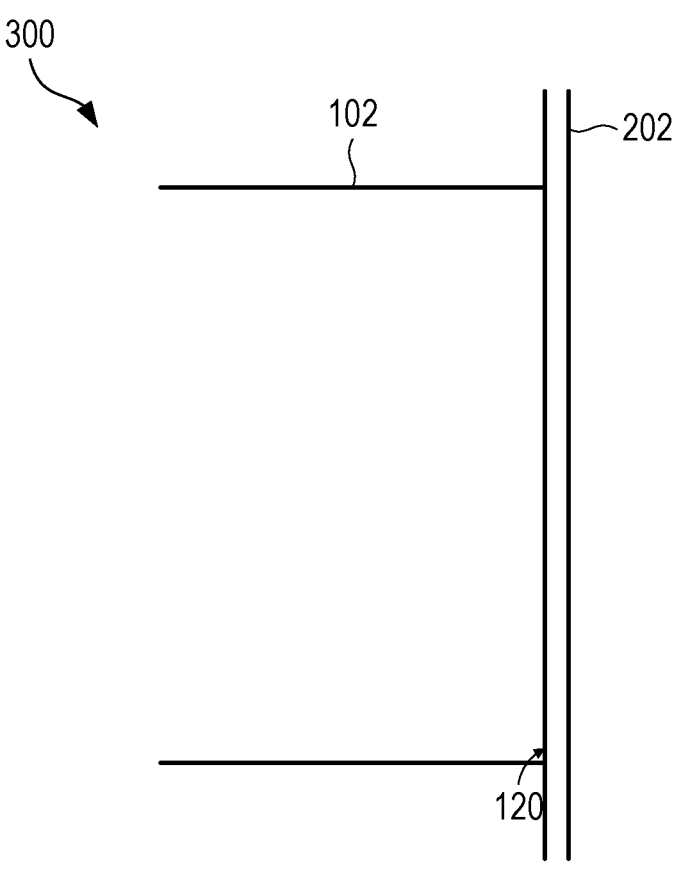
FIG. 3 shows a side view of some examples of a portion of an augmented reality system, in which the reflectivity-reducing film has been adhered to the edge surface of the waveguide.
Figure 4:
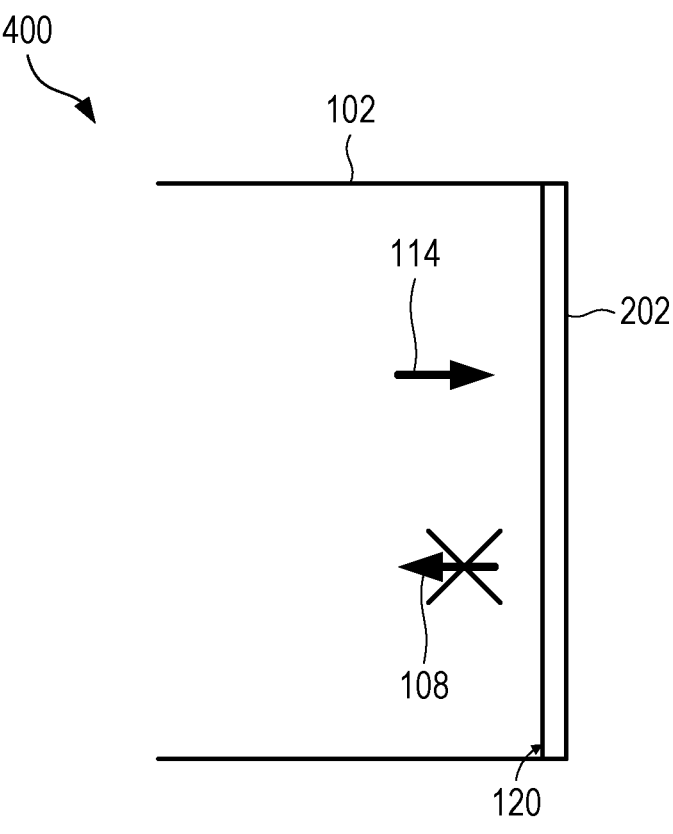
FIG. 4 shows a side view of some examples of a portion of an augmented reality system, in which the reflectivity-reducing film has been adhered to the edge surface of the waveguide and trimmed to have a size that generally corresponds to an area of the edge surface.

In some examples, the reflection-reducing element 122 can include a cured film. For example, the cured film can be an absorptive film that includes an absorptive material, which can absorb guided light that strikes the cured film. As another example, the cured film can be a photovoltaic film, which can convert into electrical energy at least a portion of the guided light that strikes the cured film. FIGS. 2-4 show some examples of a cured film and a technique for adhering the cured film to the edge surface of the waveguide. FIGS. 5-8 show some examples of a cured film, in which the cured film is a photovoltaic film, and a technique for adhering the cured film to the edge surface of the waveguide.

Figure 10:
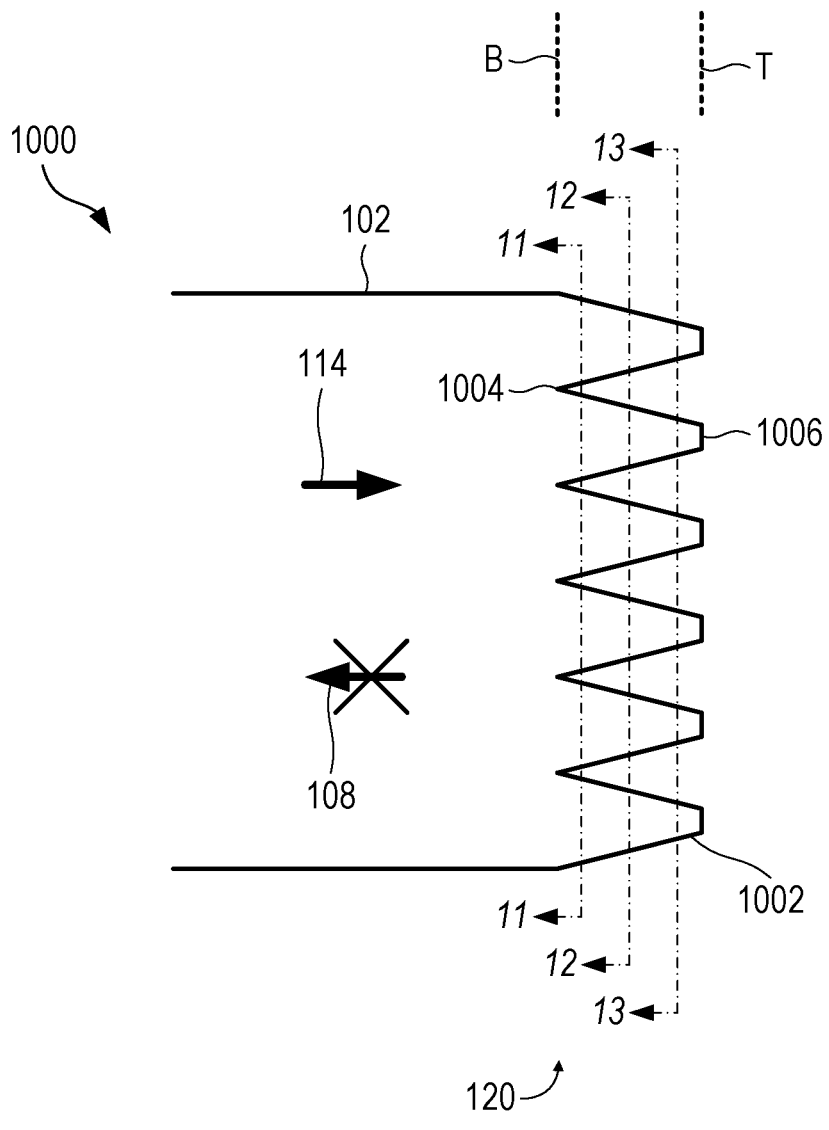
FIG. 10 shows a side view of some examples of a portion of an augmented reality system, in which the edge surface of the waveguide includes nanostructures that are configured to reduce a reflectivity of the edge surface.
Figure 11:
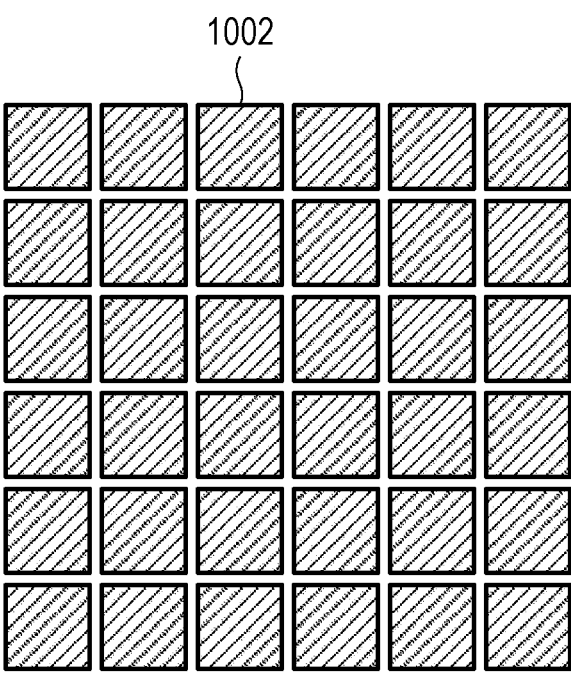
FIG. 11 shows a cross-sectional view, taken parallel to the edge surface, of the nanostructures of FIG. 10, at a first plane that is closer to the nanostructure bottoms than the nano-structure tops.

In some examples, the reflection-reducing element 122 can include nanostructures. The nanostructures can create a gradient in effective refractive index at the edge surface, which can reduce or eliminate reflections that would arise from an interface at which the refractive index changes abruptly or discontinuously (such as a planar interface between the waveguide 102 and air). FIGS. 10 and 11 show some examples of nanostructures.

FIG. 2 shows a side view of some examples of a portion 200 of an augmented reality system, in which a reflectivity-reducing film 202 is to be adhered to an edge surface 120 of a waveguide 102. The edge surface 120 can be located on opposite sides of the waveguide 102 on an axis that runs through an input grating (that receives light from a projector) and an output grating (that directs light toward an eye of the user). The reflectivity-reducing film 202 can be a cured film suitable for use as at least a portion of the reflection-reducing element 122 of the augmented reality system 100 of FIG. 1.

To form the reflectivity-reducing film 202, curable material can be disposed onto a dissolvable film, such as via one or more of an evaporative technique, sputtering, electron-beam deposition, or another suitable coating technique. The curable material can be cured while the curable material is on the dissolvable film, such that the cured material forms a reflectivity-reducing structure on the dissolvable film. For example, the curable material can be cured via one or more of thermal curing, ultraviolet light curing, moisture curing, oxygen curing, or another suitable curing techniques. Curing the curable material can cause shrinkage of the curable material. Such shrinkage can cause stresses in the dissolvable film. The dissolvable film can be dissolved, such that the reflectivity-reducing structure remains intact on the dissolved film to form the reflectivity-reducing film 202. When the dissolvable film is dissolved, the stresses disappear, such that the reflectivity-reducing structure does not include a significant amount of internal stress. The relatively stress-free reflectivity-reducing film 202 can then be adhered to the edge surface 120 of the waveguide 102 without imparting a significant amount of stress to the edge surface 120. Compared to forming the reflectivity-reducing structure directly on the edge surface 120 of the waveguide 102, which can impart stress to the edge surface 120 that can deform a shape of the edge surface 120, using the dissolvable film as described can help avoid imparting stress to the edge surface 120 and can thereby help avoid deforming the shape of the edge surface 120 and/or light-guiding surfaces 106A, 106B.

In some examples, the curable material can include an absorptive material, such as black ink or another suitable material that can absorb at least some of the light that strikes the absorptive material. In some examples, the reflectivity-reducing structure can include an absorptive structure. In some examples, the reflectivity-reducing film 202 can include an absorptive film.

In some examples, the curable material can include a photovoltaic material. In some examples, the reflectivity-reducing structure can include a photovoltaic structure. In some examples, the reflectivity-reducing film 202 can include a photovoltaic film. FIGS. 5-8 below show a detailed example of a photovoltaic film being attached to the edge surface of the waveguide.

Returning to FIG. 2, a primer layer 204 can be applied onto the edge surface 120 of the waveguide 102. In some examples, the primer layer 204 can include adhesive material, which can adhere the reflectivity-reducing film to the edge surface 120. The primer layer 204 may not require curing and therefore may not shrink and impart stress to the edge surface 120.

FIG. 3 shows a side view of some examples of a portion 300 of an augmented reality system, in which the reflectivity-reducing film 202 has been adhered to the edge surface 120 of the waveguide 102. The reflectivity-reducing film 202 can be a cured film suitable for use as at least a portion of the reflection-reducing element 122 of the augmented reality system 100 of FIG. 1.

In some examples, at least a portion of the reflectivity-reducing film 202 has been positioned onto the primer layer 204 such that the primer layer 204 adheres the reflectivity-reducing film 202 to the edge surface 120. In some examples, the reflectivity-reducing film 202 has been forced against the edge surface 120 of the waveguide 102. In some examples, the primer layer 204 has adhered or attached the reflectivity-reducing film 202 to the edge surface 120 of the waveguide 102. Such an attachment may not require curing, such that the reflectivity-reducing film 202 may not shrink during adhesion to the edge surface 120, and therefore may not impart any stresses to the edge surface 120.

FIG. 4 shows a side view of some examples of a portion 400 of an augmented reality system, in which the reflectivity-reducing film 202 has been adhered to the edge surface 120 of the waveguide 102 and trimmed to have a size that generally corresponds to an area of the edge surface 120. For example, the size can be 100%, 90%, 80%, 70%, or another suitable fraction of the area of the edge surface 120. In some examples, the reflectivity-reducing film 202 can be trimmed to cover a central area of the edge surface 120 of the waveguide 102, such that a border area remains uncovered. Including an uncovered border area may help ensure that the reflectivity-reducing film 202 does not snag or tear during assembly of the augmented reality system.

The reflectivity-reducing film 202 can receive at least some guided light 114 that strikes the reflectivity-reducing film 202. In response to receiving the guided light 114, the reflectivity-reducing film 202 can produce a diminished reflection 108 or may not produce a reflection at all. Specifically, the diminished reflection 108 may include less optical power than a reflection from a planar interface between the waveguide 102 and air. By reducing or eliminating the amount of light that is reflected, the reflectivity-reducing film 202 can reduce spurious stray light that may be included with light extracted from the waveguide 102 and can therefore increase a contrast of an image produced by the augmented reality system 100 (FIG. 1).

Figure 5:
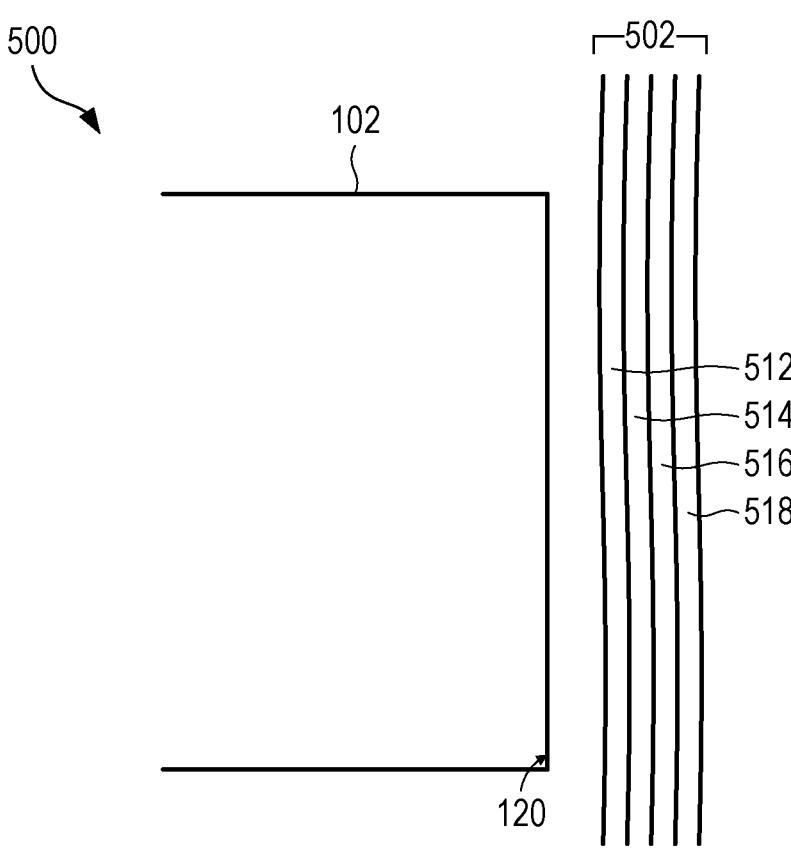
FIG. 5 shows a side view of some examples of a portion of an augmented reality system, in which a photovoltaic film is to be adhered to an edge surface of a waveguide.

FIG. 5 shows a side view of some examples of a portion 500 of an augmented reality system, in which a photovoltaic film 502 is to be adhered to an edge surface 120 of a waveguide 102. The photovoltaic film 502 can be a cured film (and a specific example of a reflectivity-reducing film) that is suitable for use as at least a portion of the reflection-reducing element 122 of the augmented reality system 100 of FIG. 1.

The photovoltaic film 502 can include a photovoltaic layered structure, which can further convert into electrical energy at least a portion of the guided light that strikes the photovoltaic layered structure.

The photovoltaic layered structure can include a first electrode 512 that is to be disposed on the edge surface 120 of the waveguide 102. The first electrode 512 can be formed from a material that is at least substantially transparent at a wavelength of the guided light, such as indium tin oxide (ITO), fluorine doped tin oxide (FTO), doped zinc oxide (ZnO), or one or more other suitable materials, optionally with one or more dopants.

The photovoltaic layered structure can include a first photovoltaic material layer 514 disposed on the first electrode 512, and a second photovoltaic material layer 516 disposed on the first photovoltaic material layer 514. In some examples, an interface between the first photovoltaic material layer 514 and the second photovoltaic material layer 516 can form a p-n junction. In some examples, the first photovoltaic material layer 514 and the second photovoltaic material layer 516 can convert into the electrical energy at least a portion of the guided light that strikes the first photovoltaic material layer 514 and the second photovoltaic material layer 516 (e.g., the p-n junction).

The first photovoltaic material layer 514 and the second photovoltaic material layer 516 can be formed from semiconductor materials that can absorb the guided light 114. For absorption, the electrical bandgap of the semiconductor material can be less than a lowest photon energy of the guided light 114. Suitable semiconductor materials for the first photovoltaic material layer 514 and the second photovoltaic material layer 516 can include perovskite, octylammonium iodide, Spiro-OMeTAD (2,2',7,7'-tetrakis(N,N-di-p-methoxyphenyl-amine)9,9'-spirobifluorene), copper indium gallium selenide (CIGS), cadmium sulfide (CdS), cadmium telluride (CdTe), and others. The first photovoltaic material layer 514 and the second photovoltaic material layer 516 can include different materials or the same material having different dopants and/or different concentrations of a same dopant.

In other examples, the first photovoltaic material layer 514 and the second photovoltaic material layer 516 can optionally include an intrinsic layer therebetween, such that the first photovoltaic material layer 514, the intrinsic layer, and the second photovoltaic material layer 516 form a p-i-n junction. Other suitable junction structures can also be used to convert incident light into electrical energy.

The photovoltaic layered structure can include a second electrode 518 disposed on the second photovoltaic material layer 516. In some examples, the second electrode 518 can be formed from the same material as the first electrode 512. In other examples, because the second electrode 518 can optionally be opaque or at least partially opaque at the wavelength of the guided light, the second electrode 518 can be formed from an electrically conductive metal, such as silver, aluminum, gold, copper, or others.

Figure 6:
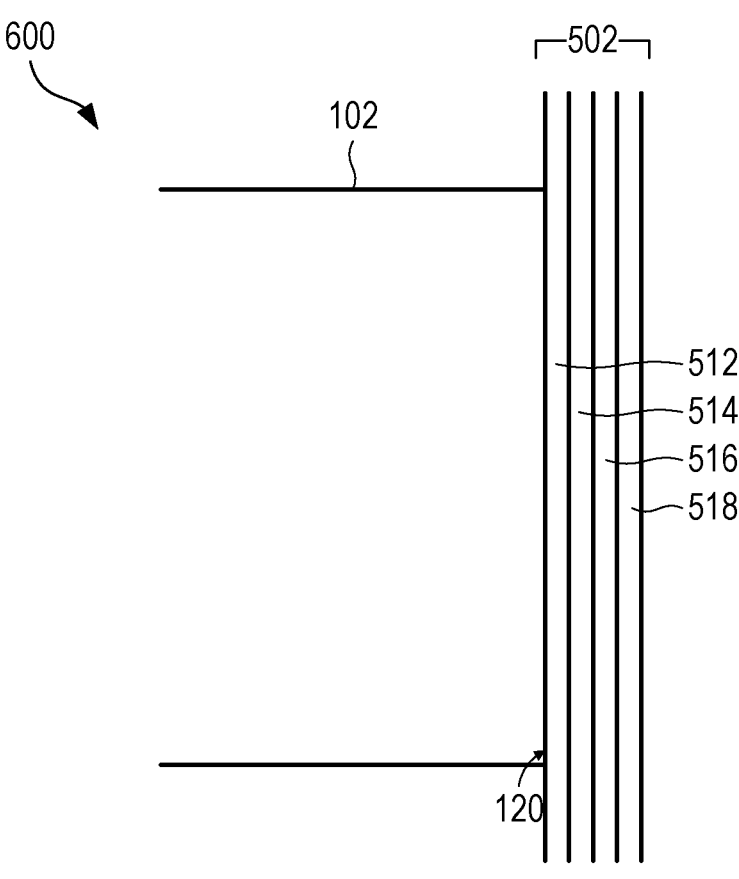
FIG. 6 shows a side view of some examples of a portion of an augmented reality system, in which the photovoltaic film has been adhered to the edge surface of the waveguide.

FIG. 6 shows a side view of some examples of a portion 600 of an augmented reality system, in which the photovoltaic film 502 has been adhered to the edge surface 120 of the waveguide 102. The photovoltaic film 502 can be a cured film (and a specific example of a reflectivity-reducing film) that is suitable for use as at least a portion of the reflection-reducing element 122 of the augmented reality system 100 of FIG. 1.

In some examples, at least a portion of the photovoltaic film 502 has been positioned onto a primer layer (not shown) such that the primer layer adheres the photovoltaic film 502 to the edge surface 120. In some examples, the photovoltaic film 502 has been forced against the edge surface 120 of the waveguide 102. In some examples, the primer layer has adhered or attached the photovoltaic film 502 to the edge surface 120 of the waveguide 102. Such an adhesion may not require curing, such that the photovoltaic film 502 may not shrink during adhesion to the edge surface 120, and therefore may not impart any stresses to the edge surface 120.

Figure 7:
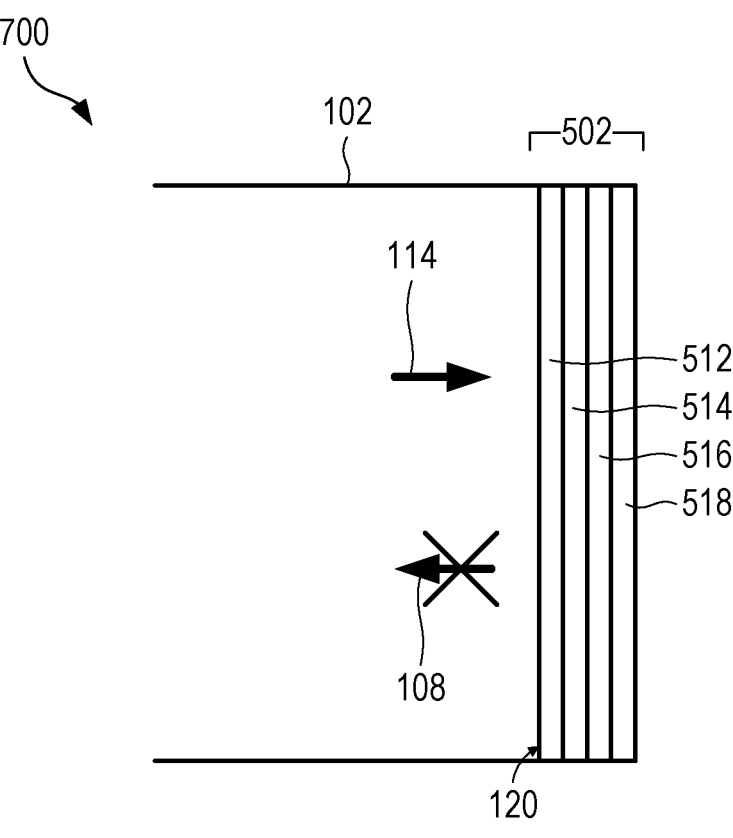
FIG. 7 shows a side view of some examples of a portion of an augmented reality system, in which the photovoltaic film has been adhered to the edge surface of the waveguide and trimmed to have a size that generally corresponds to an area of the edge surface.

FIG. 7 shows a side view of some examples of a portion 700 of an augmented reality system, in which the photovoltaic film 502 has been adhered to the edge surface 120 of the waveguide 102 and trimmed to have a size that generally corresponds to an area of the edge surface 120.

The photovoltaic film 502 can receive at least some guided light 114 that strikes the photovoltaic film 502. In response to receiving the guided light 114, the photovoltaic film 502 can produce a diminished reflection 108 or may not produce a reflection at all. Specifically, the diminished reflection 108 may include less optical power than a reflection from a planar interface between the waveguide 102 and air. By reducing or eliminating the amount of light that is reflected, the photovoltaic film 502 can reduce spurious stray light that may be included with light extracted from the waveguide 102 and can therefore increase a contrast of an image produced by the augmented reality system 100 (FIG. 1).

Figure 8:
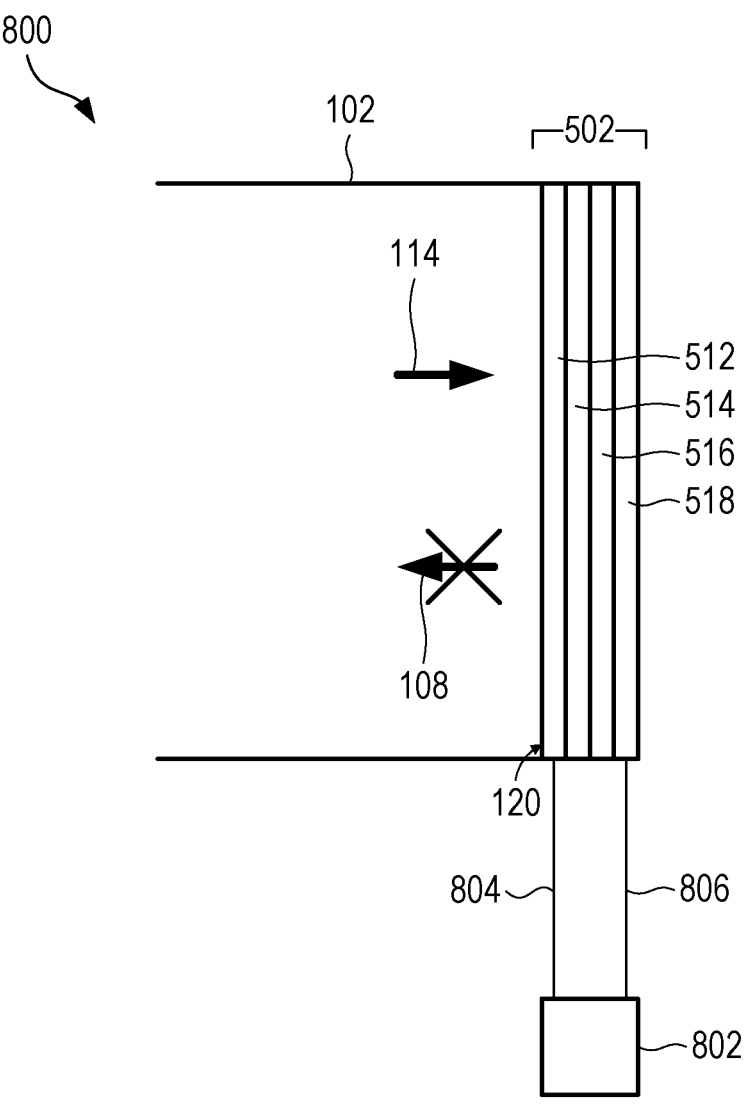
FIG. 8 shows a side view of some examples of a portion of an augmented reality system, in which the photovoltaic film has been adhered to the edge surface of the waveguide, trimmed to have a size that generally corresponds to an area of the edge surface, and electrically connected to a battery.

FIG. 8 shows a side view of some examples of a portion 800 of an augmented reality system, in which the photovoltaic film 502 has been adhered to the edge surface 120 of the waveguide 102, trimmed to have a size that generally corresponds to an area of the edge surface 120, and electrically connected to a battery 802. The battery 802 can be electrically connected to the photovoltaic film 502 and can store the electrical energy generated by the photovoltaic film 502.

In some examples, the battery 802 can be electrically connected to the first photovoltaic material layer 514 and the second photovoltaic material layer 516 via the first electrode 512 and the second electrode 518, respectively. For example, the battery 802 can have a first terminal that is electrically connected to the first electrode 512 by a first contact wire 804, and a second terminal that is electrically connected to the second electrode 518 by a second contact wire 806. In some examples, the first contact wire 804 and the second contact wire 806 can be printed on a suitable substrate using silver, gold, aluminum, copper, or another or metal or other suitable electrically conductive material.

In some examples, the battery 802 can be a system battery (or can be electrically coupled to a system battery), which can electrically power the light source 112 (FIG. 1) and other suitable circuitry in the augmented reality system. In this manner, the augmented reality system can convert otherwise wasted light from the waveguide 102 into electrical energy and can therefore reduce an overall energy consumption of the augmented reality system.

FIG. 9 shows a flow chart for some examples of a method 900 for reducing reflections in a waveguide, such as the waveguide 102. The method 900 is but one example of a method for reducing reflections in a waveguide; other methods can also be used.

At operation 902, curable material can be disposed onto a dissolvable film.

At operation 904, the curable material can be cured while the curable material is on the dissolvable film, such that the cured material forms a reflectivity-reducing structure on the dissolvable film. In some examples, the curing can include one of thermal curing, ultraviolet light curing, moisture curing, or oxygen curing. Other curing techniques can also be used. In some examples, the curing can introduce shrinkage of the curable material. The shrinkage of the curable material can introduce stress in the dissolvable film and may not introduce stress on the edge surface of the waveguide.

At operation 906, the dissolvable film can be dissolved such that the reflectivity-reducing structure remains intact on the dissolved film to form a reflectivity-reducing film.

At operation 906, a primer layer can be applied onto an edge surface of the waveguide. The edge surface can extend between light-guiding surfaces of the waveguide.

At operation 910, at least a portion of the reflectivity-reducing film can be positioned onto the primer layer such that the primer layer adheres the reflectivity-reducing film to the edge surface.

In some examples, the method 900 can optionally further include trimming the reflectivity-reducing film to have a size that generally corresponds to an area of the edge surface.

In some examples, the curable material can include an absorptive material. The reflectivity-reducing structure can include an absorptive structure. The reflectivity-reducing film can include an absorptive film. The absorptive film can include black ink or another suitable absorptive material.

In some examples, the curable material can include a photovoltaic material. The reflectivity-reducing structure can include a photovoltaic structure. The reflectivity-reducing film can include a photovoltaic film.

In some examples, the photovoltaic film can include a first electrode disposed on the edge surface and being at least substantially transparent at a wavelength of light guided by the waveguide. A first photovoltaic material layer can be disposed on the first electrode. A second photovoltaic material layer can be disposed on the first photovoltaic material layer. The first and second photovoltaic material layers can be configured to convert into electrical energy at least a portion of the guided light that strikes the first and second photovoltaic material layers. A second electrode can be disposed on the second photovoltaic material layer.

In some examples, the method 900 can optionally further include storing the electrical energy in a battery that is electrically connected to the first and second photovoltaic material layers via the first and second electrodes.

FIG. 10 shows a side view of some examples of a portion 1000 of an augmented reality system, in which the edge surface 120 of the waveguide 102 includes nanostructures 1002 that are configured to reduce a reflectivity of the edge surface 120. The nanostructures 1002 can be suitable for use as at least a portion of the reflection-reducing element 122 of the augmented reality system 100 of FIG. 1.

In some examples, the nanostructures 1002 can be sized smaller than half of a wavelength of light guided by the waveguide 102. For example, for light in the visible portion of the electromagnetic spectrum, with wavelengths between about 400 nm and about 700 nm, the nanostructures 1002 can be sized smaller than about 400 nm or sized smaller than about 200 nm. In some examples, each nanostructure 1002 can have a lateral dimension, along a plane that is parallel to the edge surface 120, that is smaller than 400 nm or smaller than 200 nm, or smaller than the wavelength or half the wavelength of light guided by the waveguide 102.

In some examples, the nanostructures 1002 can be sized to modulate a refractive index at the edge surface. For example, each location along a longitudinal axis that is orthogonal to the edge surface 120 can have an effective refractive index. The effective refractive index can change smoothly (e.g. without discontinuities) over a range of effective refractive indices, the range being between a refractive index of a material of the waveguide 102 and a refractive index of air (e.g., 1). Because the effective refractive index can vary smoothly along the longitudinal axis, there can be reduced reflections (compared to a reflection at a planar interface between the waveguide 102 and air).

In some examples, the nanostructures 1002 can have nanostructure bottom portions that face an interior of the waveguide 102 and nanostructure top portions that face away from the interior of the waveguide 102. For example, a nanostructure top portion can include a location, structure, or height, or surface of a nanostructure located farthest away from the interior of the waveguide 102. In some examples, the nanostructure bottom portions can include nanostructure bottoms 1004 that can be disposed in a plane (B). In some examples, the nanostructure top portions can include nanostructure tops 1006 that can be disposed in a plane (T). The terms "bottom" and "top" as used herein are intended to refer to particular locations on the nanostructures 1002 and are not intended to correspond to absolute positions with respect to the Earth's gravitational field or any other frame of reference.

The nanostructures 1002 can have a material fill factor taken in a cross-sectional plane that is parallel to the edge surface 120. The material fill factor can correspond to a fraction of a unit cross-sectional area that is occupied by the nanostructures 1002. The material fill factor can decrease from the nanostructure bottoms 1004 to the nanostructure tops 1006. For example, FIGS. 11-13 show respective cross-sections of the nanostructures 1002, taken in respective cross-sectional planes that are parallel to the edge surface 120.

FIG. 11 shows a cross-sectional view, taken parallel to the edge surface 120, of the nanostructures 1002 of FIG. 10, at a first plane that is closer to the nanostructure bottoms 1004 than the nanostructure tops 1006. In the first plane shown in FIG. 11, the nanostructures 1002 occupy 76.6% of the cross-sectional area, such that the material fill factor is 76.6%.

Figure 12:
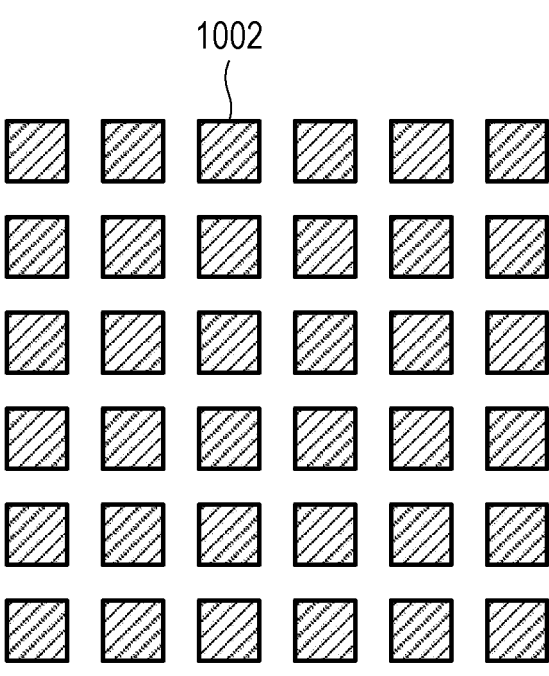
FIG. 12 shows a cross-sectional view, taken parallel to the edge surface, of the nanostructures of FIG. 10, at a second plane that is halfway between the nanostructure bottoms and the nanostructure tops.

FIG. 12 shows a cross-sectional view, taken parallel to the edge surface 120, of the nanostructures 1002 of FIG. 10, at a second plane that is halfway between the nanostructure bottoms 1004 and the nanostructure tops 1006. In the second plane shown in FIG. 12, the nanostructures 1002 occupy 39.1% of the cross-sectional area, such that the material fill factor is 39.1%.

Figure 13:
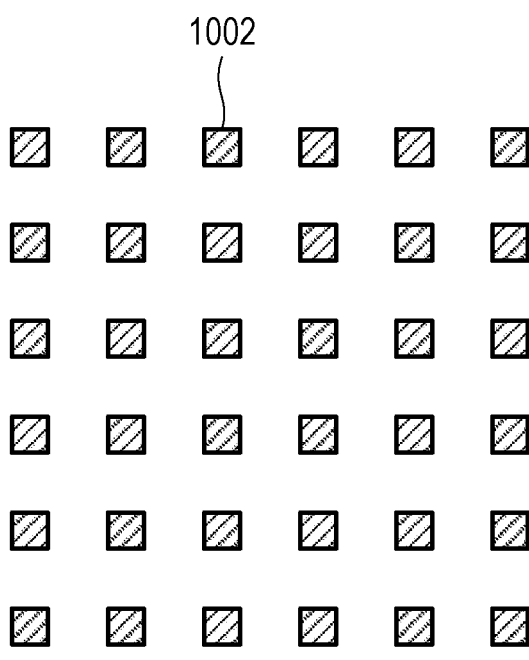
FIG. 13 shows a cross-sectional view, taken parallel to the edge surface, of the nanostructures of FIG. 10, at a third plane that closer to the nanostructure tops than the nano-structure bottoms.

FIG. 13 shows a cross-sectional view, taken parallel to the edge surface 120, of the nanostructures 1002 of FIG. 10, at a third plane that closer to the nanostructure tops 1006 than the nanostructure bottoms 1004. In the second plane shown in FIG. 12, the nanostructures 1002 occupy 14.1% of the cross-sectional area, such that the material fill factor is 14.1%.

The numerical examples of FIGS. 11-13 are but mere examples. In practice, any suitable numerical values can also be used. In some examples, the material fill factor can decrease, optionally monotonically, from a maximum value, such as 100% or a value less than 100%, to a minimum value, such as 0% or a value greater than 0%, from the nanostructure tops 1006 to the nanostructure bottoms 1004. The cross-sectional shapes of the nanostructures 1002, taken parallel to the edge surface 120, can be square, rectangular, circular, elliptical, elongated, or any other suitable cross-sectional shape. The nanostructures 1002 can be amorphous, or can have other shapes, such as cones.

The nanostructures 1002 can define an effective refractive index for each cross-sectional plane from the nanostructure bottoms 1004 to the nanostructure tops 1006 (e.g., for each cross-sectional plane between plane (B) and plane (T)). The effective refractive index can vary as a function of the material fill factor at the cross-sectional plane. For example, the effective refractive index can equal a sum of quantities A and B, where quantity A is a product of a refractive index of the waveguide material and the material fill factor, and quantity B is a product of a refractive index of air (e.g., 1) and quantity C, where quantity C equals 100% minus the material fill factor. In some examples, such as configurations in which the material fill factor can be 100% or nearly 100% at the nanostructure bottoms 1004, the effective refractive index at the nanostructure bottoms 1004 can match or substantially match a refractive index of a waveguide material of the waveguide 102.

In some examples, the nanostructures 1002 can be shaped as pyramids, cones, a moth eye structure, as an amorphous structure, as a repeating structure, as a non-repeating structure, or as other suitable shapes. In some examples, the nanostructures 1002 can all be shaped the same. In other examples, at least some of the nanostructures 1002 can have different shapes.

In specific examples, the nanostructures 1002 can be shaped as pyramids. Each pyramid can have a pyramid bottom that faces an interior of the waveguide 102 and a pyramid top that faces away from the interior of the waveguide 102. Each pyramid can have a cross-sectional area taken in a cross-sectional plane that is parallel to the edge surface 120. The cross-sectional area can decrease monotonically from the pyramid bottom to the pyramid top. Each pyramid can define an effective refractive index for each cross-sectional plane from the pyramid bottom to the pyramid top. The effective refractive index can vary as a function of the cross-sectional area of the pyramid at the cross-sectional plane. The effective refractive index at the bottom of the pyramid can match a refractive index of a waveguide material of the waveguide 102.

In some examples, such as the configuration of FIG. 10, the pyramid top can include an area that is generally flat and parallel to the plane of the edge surface 120. For these examples, the effective refractive index at the pyramid top can differ slightly from a refractive index of air.

Figure 14:
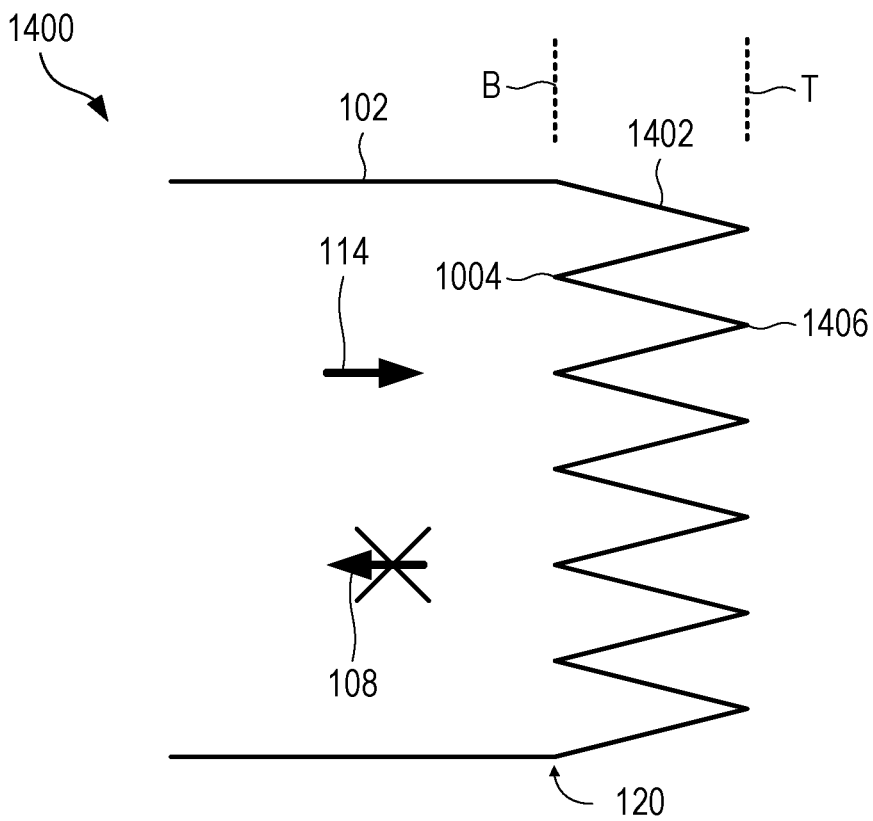
FIG. 14 shows a side view of some examples of a portion of an augmented reality system, in which the edge surface of the waveguide includes nanostructures that are configured to reduce a reflectivity of the edge surface.

FIG. 14 shows a side view of some examples of a portion 1400 of an augmented reality system, in which the edge surface 120 of the waveguide 102 includes nanostructures 1402 that are configured to reduce a reflectivity of the edge surface 120. The nanostructures 1402 can be suitable for use as at least a portion of the reflection-reducing element 122 of the augmented reality system 100 of FIG. 1.

In the configuration of FIG. 14, the nanostructure top 1406 can lack an area that is generally flat and parallel to the plane of the edge surface 120. The effective refractive index at the nanostructure top 1406 can substantially equal a refractive index of air.

As a further configuration for the reflection-reducing element 122, an antireflection structure can be laser patterned directly on the edge surface 120 of the waveguide 102.

The structures and methods as described with reference to FIGS. 1-14 may be used to prepare wafers, as will be understood by one skilled in the art of nanofabrication technology, to enable the preparation of multiple diffractive waveguide combiners (DWC) in a single operation. Each wafer can have a sufficient area to accommodate multiple DWCs. Each region of the wafer may be configured with specifically profiled etchable layers, as described with reference to FIGS. 1-14, which are specific to a particular DWC nanostructure arrangement.

In some examples, each wafer may be used to produce a number of identical DWCs, with the wafer being configured with identical regions with respect to the variation in thickness profile across the region of each DWC.

In other examples, each wafer may be configured to prepare DWCs that are specific to a specific wavelength of light, for example, red, green, and blue, or red, green, cyan, and violet. In these examples, a single wafer may yield sufficient number of DWC elements necessary to produce a final waveguide design that includes stacked red, green, and blue, or stacked red, green, cyan, and violet-specific DWCs which can achieve a full color image when light is introduced.

The wafers produced according to the methods discussed above may subsequently be used in a step and repeat nano imprint lithography process to produce large quantities of DWC devices.

The above detailed description includes references to the accompanying drawings, which form a part of the detailed description. The drawings show, by way of illustration, specific embodiments that can be practiced. These embodiments may also be referred to herein as "examples." Such embodiments or examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. That is, the above-described embodiments or examples or one or more aspects, features, or elements thereof can be used in combination with each other.

To further illustrate the system and related method disclosed herein, a non-limiting list of examples is provided below. Each of the following non limiting examples can stand on its own or can be combined in any permutation or combination with any one or more of the other examples.

In Example 1, a method for reducing reflections in a waveguide can comprise: disposing curable material onto a dissolvable film; curing the curable material while the curable material is on the dissolvable film, such that the cured material forms a reflectivity-reducing structure on the dissolvable film; dissolving the dissolvable film such that the reflectivity-reducing structure remains intact on the dissolved film to form a reflectivity-reducing film; applying a primer layer onto an edge surface of the waveguide, the edge surface extending between light-guiding surfaces of the waveguide; and positioning at least a portion of the reflectivity-reducing film onto the primer layer such that the primer layer adheres the reflectivity-reducing film to the edge surface.

In Example 2, the method of Example 1 can be optionally configured such that: the curing introduces shrinkage of the curable material; and the shrinkage of the curable material introduces stress in the dissolvable film and does not introduce stress on the edge surface of the waveguide.

In Example 3, the method of any one of Examples 1-2 can be optionally configured such that the curing comprises at least one of thermal curing, ultraviolet light curing, moisture curing, or oxygen curing.

In Example 4, the method of any one of Examples 1-3 can optionally further comprise: trimming the reflectivity-reducing film to have a size that generally corresponds to an area of the edge surface.

In Example 5, the method of any one of Examples 1-4 can be optionally configured such that: the curable material comprises an absorptive material; the reflectivity-reducing structure comprises an absorptive structure; and the reflectivity-reducing film comprises an absorptive film.

In Example 6, the method of any one of Examples 1-5 can be optionally configured such that: the curable material comprises a photovoltaic material; the reflectivity-reducing structure comprises a photovoltaic structure; and the reflectivity-reducing film comprises a photovoltaic film.

In Example 7, the method of any one of Examples 1-6 can be optionally configured such that the photovoltaic film comprises: a first electrode disposed on the edge surface and being at least substantially transparent at a wavelength of light guided by the waveguide; a first photovoltaic material layer disposed on the first electrode; a second photovoltaic material layer disposed on the first photovoltaic material layer, the first and second photovoltaic material layers being configured to convert into electrical energy at least a portion of the guided light that strikes the first and second photovoltaic material layers; and a second electrode disposed on the second photovoltaic material layer.

In Example 8, the method of any one of Examples 1-7 can optionally further comprise: storing the electrical energy in a battery that is electrically connected to the first and second photovoltaic material layers via the first and second electrodes.

In Example 9, an augmented reality system can comprise: a waveguide having opposing light-guiding surfaces and an edge surface that extends between the opposing light-guiding surfaces, the waveguide configured to guide guided light between the opposing light-guiding surfaces toward the edge surface; and a cured film disposed on the edge surface and configured to reduce a reflectivity of the edge surface.

In Example 10, the augmented reality system of Example 9 can optionally be configured such that the cured film comprises an absorptive material.

In Example 11, the augmented reality system of any one of Examples 9-10 can optionally be configured such that the cured film comprises a photovoltaic film, the photovoltaic film including a photovoltaic layered structure that is configured to convert at least a portion of the guided light that strikes the photovoltaic layered structure into electrical energy.

In Example 12, the augmented reality system of any one of Examples 9-11 can optionally be configured such that the photovoltaic layered structure comprises: a first electrode disposed on the edge surface and being at least substantially transparent at a wavelength of light guided by the waveguide; a first photovoltaic material layer disposed on the first electrode; a second photovoltaic material layer disposed on the first photovoltaic material layer, the first and second photovoltaic material layers being configured to convert into electrical energy at least a portion of the guided light that strikes the material layer; and a second electrode disposed on the second photovoltaic material layer.

In Example 13, an augmented reality system can comprise: a waveguide having opposing light-guiding surfaces and an edge surface that extends between the opposing light-guiding surfaces, the waveguide configured to guide guided light between the opposing light-guiding surfaces toward the edge surface; and a photovoltaic film disposed on the edge surface and configured to reduce a reflectivity of the edge surface, the photovoltaic film being further configured to convert into electrical energy at least a portion of the guided light that strikes the photovoltaic film.

In Example 14, the augmented reality system of Example 13 can optionally further comprise a battery electrically connected to the photovoltaic film and configured to store the electrical energy.

In Example 15, the augmented reality system of any one of Examples 13-14 can optionally be configure such that the photovoltaic film comprises: a first electrode disposed on the edge surface and being at least substantially transparent at a wavelength of the guided light; a first photovoltaic material layer disposed on the first electrode; a second photovoltaic material layer disposed on the first photovoltaic material layer, the first and second photovoltaic material layers being configured to convert into the electrical energy at least a portion of the guided light that strikes the first and second photovoltaic material layers; and a second electrode disposed on the second photovoltaic material layer, wherein the battery is electrically connected to the first and second photovoltaic material layers via the first and second electrodes.

In Example 16, an augmented reality system can comprise: a waveguide having opposing light-guiding surfaces and an edge surface that extends between the opposing light-guiding surfaces, the waveguide configured to guide guided light between the opposing light-guiding surfaces toward the edge surface, and the edge surface including nanostructures that are configured to reduce a reflectivity of the edge surface.

In Example 17, the augmented reality system of Example 16 can optionally be configured such that the nanostructures are sized to modulate a refractive index at the edge surface.

In Example 18, the augmented reality system of any one of Examples 16-17 can optionally be configured such that: the nanostructures have nanostructure bottoms that face an interior of the waveguide, and nanostructure tops that face away from the interior of the waveguide; the nanostructures have a material fill factor taken in a cross-sectional plane that is parallel to the edge surface, the material fill factor corresponding to a fraction of a unit cross-sectional area that is occupied by the nanostructures, the material fill factor decreasing from the nanostructure bottoms to the nanostructure tops; the nanostructures define an effective refractive index for each cross-sectional plane from the nanostructure bottoms to the nanostructure tops, the effective refractive index varying as a function of the material fill factor at the cross-sectional plane; and the effective refractive index at the nanostructure bottoms matches a refractive index of a waveguide material of the waveguide.

In Example 19, the augmented reality system of any one of Examples 16-18 can optionally be configured such that: the nanostructures are shaped as pyramids; each pyramid has a pyramid bottom that faces an interior of the waveguide and a pyramid top that faces away from the interior of the waveguide; each pyramid has a cross-sectional area taken in a cross-sectional plane that is parallel to the edge surface, the cross-sectional area decreasing monotonically from the pyramid bottom to the pyramid top; each pyramid defines an effective refractive index for each cross-sectional plane from the pyramid bottom to the pyramid top, the effective refractive index varying as a function of the cross-sectional area of the pyramid at the cross-sectional plane; and the effective refractive index at the bottom of the pyramid matches a refractive index of a waveguide material of the waveguide.

In Example 20, the augmented reality system of any one of Examples 16-19 can optionally be configured such that: the pyramid top lacks an area that is generally flat and parallel to the plane of the edge surface; and the effective refractive index at the pyramid top substantially equals a refractive index of air.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

What is claimed is:

1. A method for reducing reflections in a waveguide, the method comprising:
    disposing curable material onto a dissolvable film;

curing the curable material while the curable material is on the dissolvable film, such that the cured material forms a reflectivity-reducing structure on the dissolvable film;
dissolving the dissolvable film such that the reflectivity-reducing structure remains intact on the dissolved film to form a reflectivity-reducing film;
applying a primer layer onto an edge surface of the waveguide, the edge surface extending between light-guiding surfaces of the waveguide; and
positioning at least a portion of the reflectivity-reducing film onto the primer layer such that the primer layer adheres the reflectivity-reducing film to the edge surface,
wherein:
    the curing introduces shrinkage of the curable material; and
    the shrinkage of the curable material introduces stress in the dissolvable film and does not introduce stress on the edge surface of the waveguide.

2. The method of claim 1, wherein the curing comprises at least one of thermal curing, ultraviolet light curing, moisture curing, or oxygen curing.

3. The method of claim 1, further comprising:
    trimming the reflectivity-reducing film to have a size that generally corresponds to an area of the edge surface.

4. The method of claim 1, wherein:
    the curable material comprises an absorptive material;
    the reflectivity-reducing structure comprises an absorptive structure; and
    the reflectivity-reducing film comprises an absorptive film.

5. The method of claim 1, wherein:
    the curable material comprises a photovoltaic material;
    the reflectivity-reducing structure comprises a photovoltaic structure; and
    the reflectivity-reducing film comprises a photovoltaic film.

6. The method of claim 5, wherein the photovoltaic film comprises:
    a first electrode disposed on the edge surface and being at least substantially transparent at a wavelength of light guided by the waveguide;
    a first photovoltaic material layer disposed on the first electrode;
    a second photovoltaic material layer disposed on the first photovoltaic material layer, the first and second photovoltaic material layers being configured to convert into electrical energy at least a portion of the guided light that strikes the first and second photovoltaic material layers; and
    a second electrode disposed on the second photovoltaic material layer.

7. The method of claim 6, further comprising:
    storing the electrical energy in a battery that is electrically connected to the first and second photovoltaic material layers via the first and second electrodes.

8. The method of claim 6, wherein the first electrode comprises at least one of indium tin oxide (ITO), fluorine doped tin oxide (FTO), or doped zinc oxide (ZnO).

9. The method of claim 6, wherein the second electrode comprises at least one of indium tin oxide (ITO), fluorine doped tin oxide (FTO), or doped zinc oxide (ZnO).

10. The method of claim 6, wherein:
    the second photovoltaic material layer is disposed directly on the first photovoltaic material layer; and an interface between the first photovoltaic material layer and the second photovoltaic material layer forms a p-n junction.

11. The method of claim 6, wherein:

an intrinsic layer is disposed between the second photovoltaic material layer and the first photovoltaic material layer; and the first photovoltaic material layer, the intrinsic layer, and the second photovoltaic material layer form a p-i-n junction.

12. The method of claim 6, wherein the first photovoltaic material layer comprises at least one of perovskite, octylammonium iodide, Spiro-OMeTAD (2,2',7,7'-tetrakis(N,N-di-p-methoxyphenyl-amine)9,9'-spirobifluorene), copper indium gallium selenide (CIGS), cadmium sulfide (CdS), or cadmium telluride (CdTe).

13. The method of claim 6, wherein the second photovoltaic material layer comprises at least one of perovskite, octylammonium iodide, Spiro-OMeTAD (2,2',7,7'-tetrakis (N,N-di-p-methoxyphenyl-amine)9,9'-spirobifluorene), copper indium gallium selenide (CIGS), cadmium sulfide (CdS), or cadmium telluride (CdTe).

14. The method of claim 6, wherein the first photovoltaic material layer and the second photovoltaic material layer include different materials.

15. The method of claim 6, wherein the first photovoltaic material layer and the second photovoltaic material layer include a same material having different dopants.

16. The method of claim 6, wherein the first photovoltaic material layer and the second photovoltaic material layer include a same material having different concentrations of a same dopant.

\* \* \* \* \*